(12) United States Patent
Holzman

(10) Patent No.: US 8,975,933 B1
(45) Date of Patent: Mar. 10, 2015

(54) SYSTEMS AND METHODS FOR A BYPASS FLIP FLOP WITH TRANSPARENCY

(71) Applicant: Marvell Israel (M.I.S.L.) Ltd., Yokneam (IL)

(72) Inventor: Uri Holzman, Kfar-Saba (IL)

(73) Assignee: Marvell Israel (M.I.S.L.) Ltd., Yokneam (IL)

( * ) Notice: Subject to any disclaimer, the term of this patent is extended or adjusted under 35 U.S.C. 154(b) by 0 days.

(21) Appl. No.: 13/933,336

(22) Filed: Jul. 2, 2013

Related U.S. Application Data

(60) Provisional application No. 61/667,202, filed on Jul. 2, 2012.

(51) Int. Cl.
*H03K 3/02* (2006.01)
*H03K 3/356* (2006.01)

(52) U.S. Cl.
CPC ............................... *H03K 3/356008* (2013.01)
USPC ........................................... 327/198; 327/545

(58) Field of Classification Search
CPC ....... H03K 3/0375; H03K 17/223; G06F 1/24
See application file for complete search history.

(56) References Cited

U.S. PATENT DOCUMENTS

| 7,843,218 | B1 * | 11/2010 | Ramaraju et al. ................ 326/46 |
| 8,533,522 | B2 * | 9/2013 | Roth et al. ..................... 713/600 |
| 2004/0196067 | A1 * | 10/2004 | Hossain et al. ................ 326/112 |
| 2004/0239365 | A1 * | 12/2004 | Young et al. ..................... 326/41 |
| 2007/0022339 | A1 * | 1/2007 | Branch et al. ................... 714/726 |
| 2007/0300108 | A1 * | 12/2007 | Saint-Laurent et al. ....... 714/726 |
| 2010/0088565 | A1 * | 4/2010 | Chandra ......................... 714/746 |
| 2010/0127745 | A1 * | 5/2010 | Hwang et al. .................. 327/203 |
| 2011/0066906 | A1 * | 3/2011 | Tang .............................. 714/731 |
| 2013/0103917 | A1 * | 4/2013 | Gupta ............................ 711/167 |
| 2014/0006730 | A1 * | 1/2014 | Zain et al. ...................... 711/155 |
| 2014/0111243 | A1 * | 4/2014 | Kumar Goel et al. ... 324/762.02 |
| 2014/0145761 | A1 * | 5/2014 | Salling .......................... 326/112 |

* cited by examiner

*Primary Examiner* — Adam Houston

(57) ABSTRACT

Systems and methods are provided for a data storage element. A data input is configured to receive input data to the data storage element. A latching element is configured to hold input data that is received from the data input. A pulse generator is configured to assert a pulse signal based on a clock signal, and a multiplexer is configured to select for output from the data storage element, responsively to the pulse signal, one of the input data that is received from the data input without passing through the latching element and the input data held in the latching element.

16 Claims, 8 Drawing Sheets

SYSTEMS AND METHODS FOR A BYPASS FLIP FLOP WITH TRANSPARENCY

CROSS-REFERENCE TO RELATED APPLICATIONS

This application claims priority to U.S. Provisional Patent Application No. 61/667,202, filed Jul. 2, 2012, entitled "Performance Bypass Fast Flip Flop with Transparency," which is herein incorporated in its entirety.

FIELD

The technology described herein relates generally to data storage and more particularly to reliable flip flop data storage.

BACKGROUND

Many synchronic and asynchronic designs utilize flip flops as state keepers. Because of the omnipresent nature of these devices, reliable flip flop performance is often important to maintain system stability. Such reliability is weighed against complexity and cost (e.g., footprint size cost) in developing a desirable flip flop design.

The description above is presented as a general overview of related art in this field and should not be construed as an admission that any of the information it contains constitutes prior art against the present patent application.

SUMMARY

Examples of systems and methods are provided for a data storage element. A data input is configured to receive input data to the data storage element. A latching element is configured to hold input data that is received from the data input. A pulse generator is configured to assert a pulse signal based on a clock signal, and a multiplexer is configured to select for output from the data storage element, responsively to the pulse signal, one of the input data that is received from the data input without passing through the latching element and the input data held in the latching element.

As another example, a method of providing data from a data storage element includes a step of receiving input data at a data storage element. A clock signal edge is received indicating that the input data is to be sampled. The input data is held in a latching element based on the received clock signal edge. A pulse signal is asserted for a pulse time period responsively to the received clock signal edge, and a multiplexer is selectively controlled with the pulse signal to output one of: input data that is not held in the latching element and input data that is held in the latching element.

DETAILED DESCRIPTION

Figure 1:
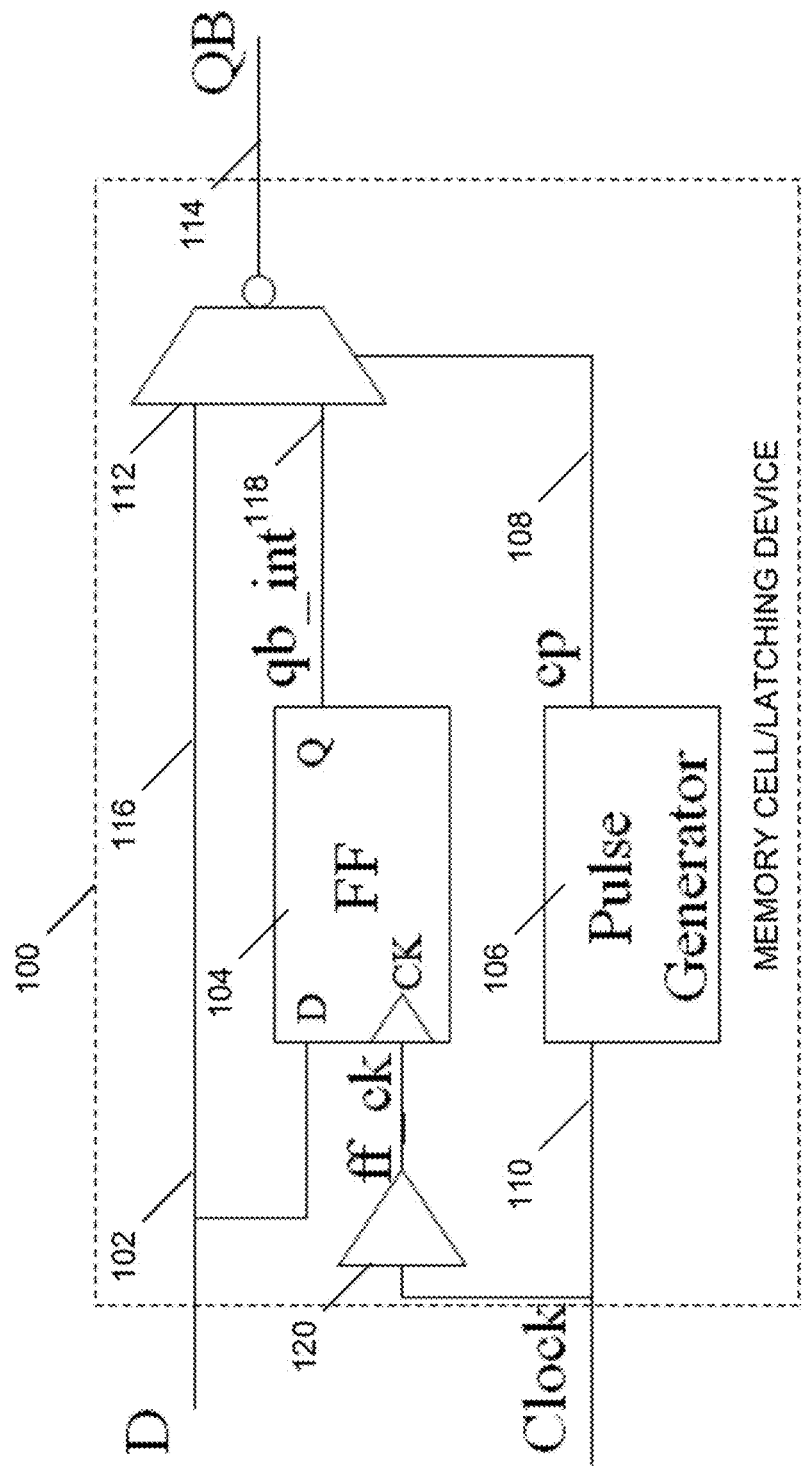
FIG. 1 is a block diagram depicting a data storage element.

FIG. 1 is a block diagram depicting a data storage element in accordance with an embodiment of the present disclosure. A data storage element 100 includes a data input 102 configured to receive input data to the data storage element 100. A latching element 104 is configured to hold input data that is received from the data element 102. A pulse generator 106 is configured to assert a pulse signal 108 based on a clock signal 110. The data storage element 100 further includes a multiplexer 112 that is configured to select for output 114 from the data storage element 100, responsively to the pulse signal 108, one of the input data that is received from the data input 102 without passing through the latching element 104 along path 116 and the input data held in the latching element via path 118.

In one embodiment of the disclosure, the latching element 104 comprises a flip flop that samples data from the data input 102 based on a rising or falling edge of the clock signal 110, buffered by buffer 120. In the example of FIG. 1, the multiplexer 112 is an inverting multiplexer, such that the output 114 of the data storage element 100 is at an opposite level as the data input 102. In other embodiments, a non-inverting multiplexer is used.

In the storage device 100 described above with respect to FIG. 1, data can be output at high speed because only a single logic level transition is required. That is, data only traverses one logic element from the data input 102 to the data storage element 100 output 114 via path 116. By comparison, conventional flip flops often require as many as four logic level transitions. While certain dynamic flops require only two logic levels, those devices are often large and include internal race conditions, which jeopardize the accuracy and reliability of flip flop performance. The bypass flip flop of FIG. 1 offers a relatively compact design that provides fast operation without any internal races.

Figure 2:
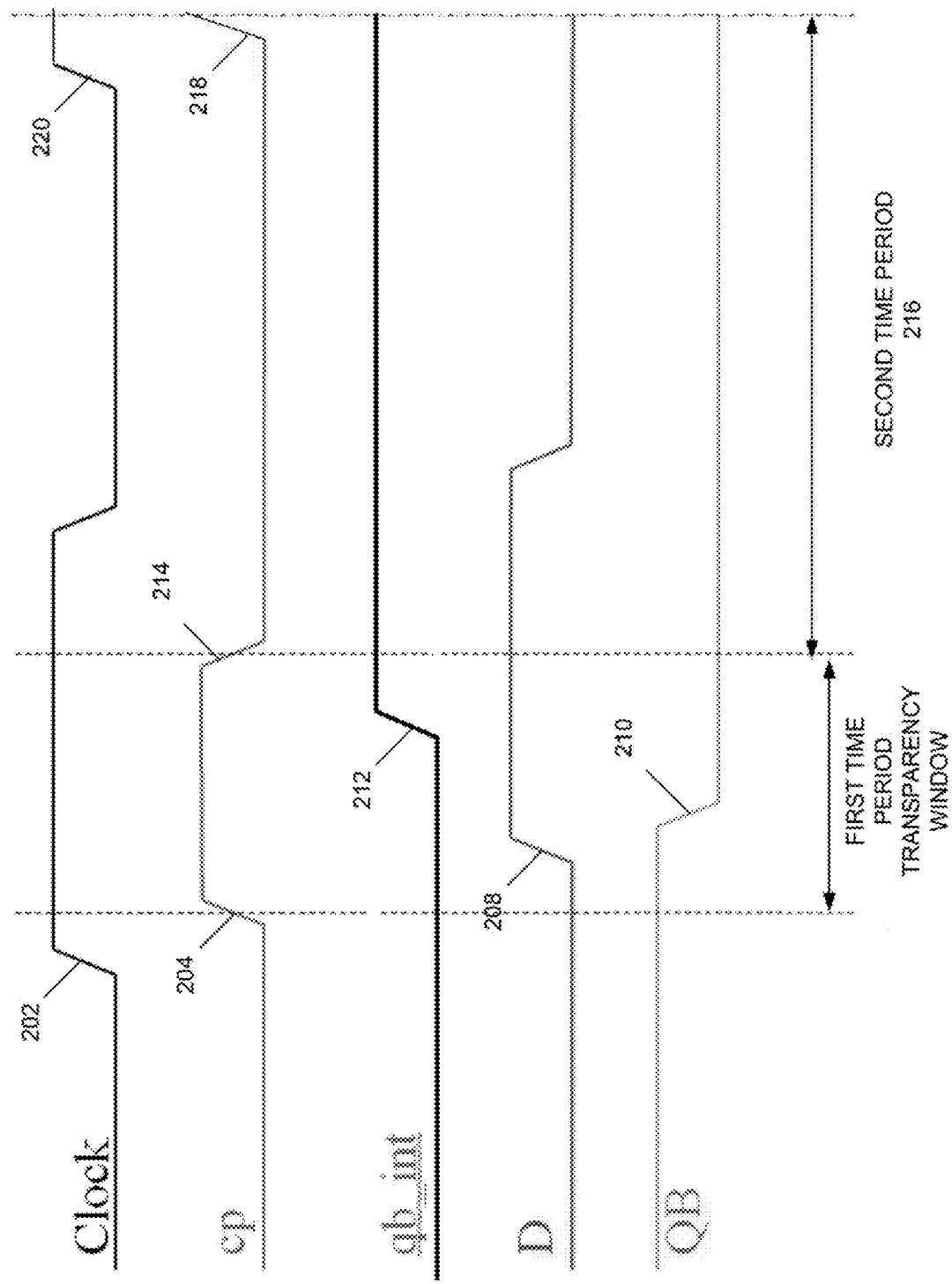
FIG. 2 is a timing diagram illustrating example operation of a data storage element.

FIG. 2 is a timing diagram illustrating example operation of a data storage element. At 202, a rising edge of the clock signal 110 signals that data from the data input 102 is ready to be sampled. Based on receipt of the clock edge 202, the pulse generator 106 asserts a pulse signal 108 at 204 that begins a first time period 206, that is also referred to herein as a transparency window. During the first time period 206, the assertion of the pulse signal 108 instructs the multiplexer 112 to output 114 the input data that is received from the data input 102 directly, along path 116, without passing through the latching element 104. Thus, during the first time period 206, the data input 102 is almost immediately reflected at the data output 114, undergoing only a single logic level transition. This is indicated in the timing diagram of FIG. 2 at 208, 210. While the clock edge at 202 indicates that data is expected to be ready for sampling at 202, in the example of FIG. 2, the data is actually slightly late in reaching the proper level. The input data received at 102 transitions during the first time period 206 from a low to high level at 208. That transition is quickly reflected at the data storage element output 114 at 210, transitioning from a high to low value through the inverting multiplexer 112, because the asserted pulse signal 108 instructs the multiplexer 112 to select the bypass data path 116 that includes only a single logic level transition.

The pulse generator 106 is configured to assert the pulse signal 108 for the predetermined period of time, identified as the first time period 206 in FIG. 2, that is longer than required for the latching element 104 to sample and store the input data from the data input 102. During that time period 206, the latching element 104 samples and stores the input data from the data input 102, based on receipt of the clock edge at 202. The success of the latching element's sampling and storing is evidenced at 212, where the output of the latching element 104 transitions to match the state of the data input 102. Once the first time period 206 has elapsed, the pulse generator 106 deasserts the pulse signal at 214. The deassertion of the pulse signal at 214 commands the multiplexer 112 to output data from the output 118 of the latching element 104 at the output 114 of the data storage element 100. The deassertion of the pulse signal 108 at 214 signals the beginning of the second time period 216, during which data is outputted 114 from the data storage element 100 via the latching element 104. The output from the latching element 104 is maintained as the output 114 of the data storage element 100 until a reassertion of the pulse signal at 218, and a new first time period 206, based on a newly received rising clock edge at 220.

Figure 3:
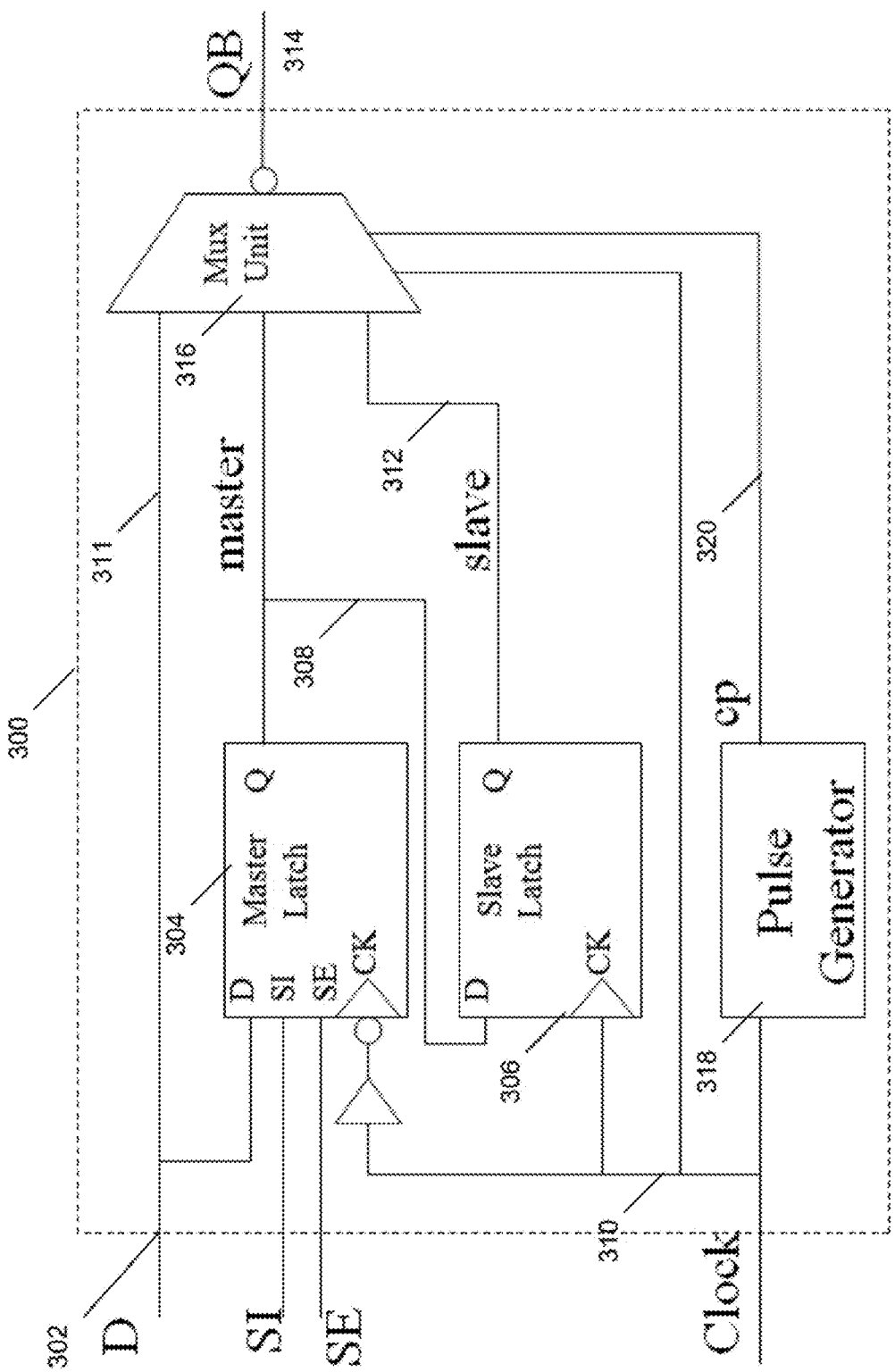
FIG. 3 is a block diagram depicting a data storage element that includes a latching element that comprises a master latch and a slave latch.

FIG. 3 is a block diagram depicting a data storage element that includes a latching element that comprises a master latch and a slave latch in accordance with an embodiment. The data storage element 300 includes a data input 302 that is configured to receive input data to the data storage element 300. The data storage element 300 includes a latching element that comprises a master latch 304 and a slave latch 306. The master latch 304 and the slave latch 306 are configured to hold input data that is received from the data input 302. The master latch 304 is configured to sample and hold data from the data input 302, and the slave latch 306 is configured to indirectly receive the input data via an output 308 of the master latch 304. The master latch 304 and the slave latch 306 perform their sample and hold operations in response to a clock signal 310. The data storage element 300 is configured to select input data from one of the data input 302 via a bypass path 311, the master latch output 308 or an output 312 of the slave latch 306 to output from the data storage element at 314 using a multiplexer 316. The multiplexer selects one of those signals 302, 308, 312 based on a command signal from a pulse generator 318 and the clock signal 310. In the embodiment of FIG. 2, the master latch 304 and the slave latch 306 are not responsive to the command signal from the pulse generator 318 for data sampling, but rather are responsive to the clock signal 310 for sampling timing.

The pulse generator 318 asserts a pulse signal via 320 during a first time period, during which the multiplexer 316 is commanded to output input data at 314 that is received from the data input 302, via bypass path 311, without passing through the master latch 304 or the slave latch 306. The pulse generator 318 deasserts the pulse signal at the end of the first time period, commanding the multiplexer 316 to output data at 314 from one of the master latch output 308 and the slave latch output 312 during a second time period. In one embodiment of the disclosure, the multiplexer 316 selects the master latch output 308 during a first sub-time period of the second time period, and the multiplexer 316 selects the slave latch output 312 during a second sub-time period, where the multiplexer is configured to transition from selecting the master latch output 308 to selecting the slave latch output 312 based on a transition of the clock signal 310.

Figure 4:
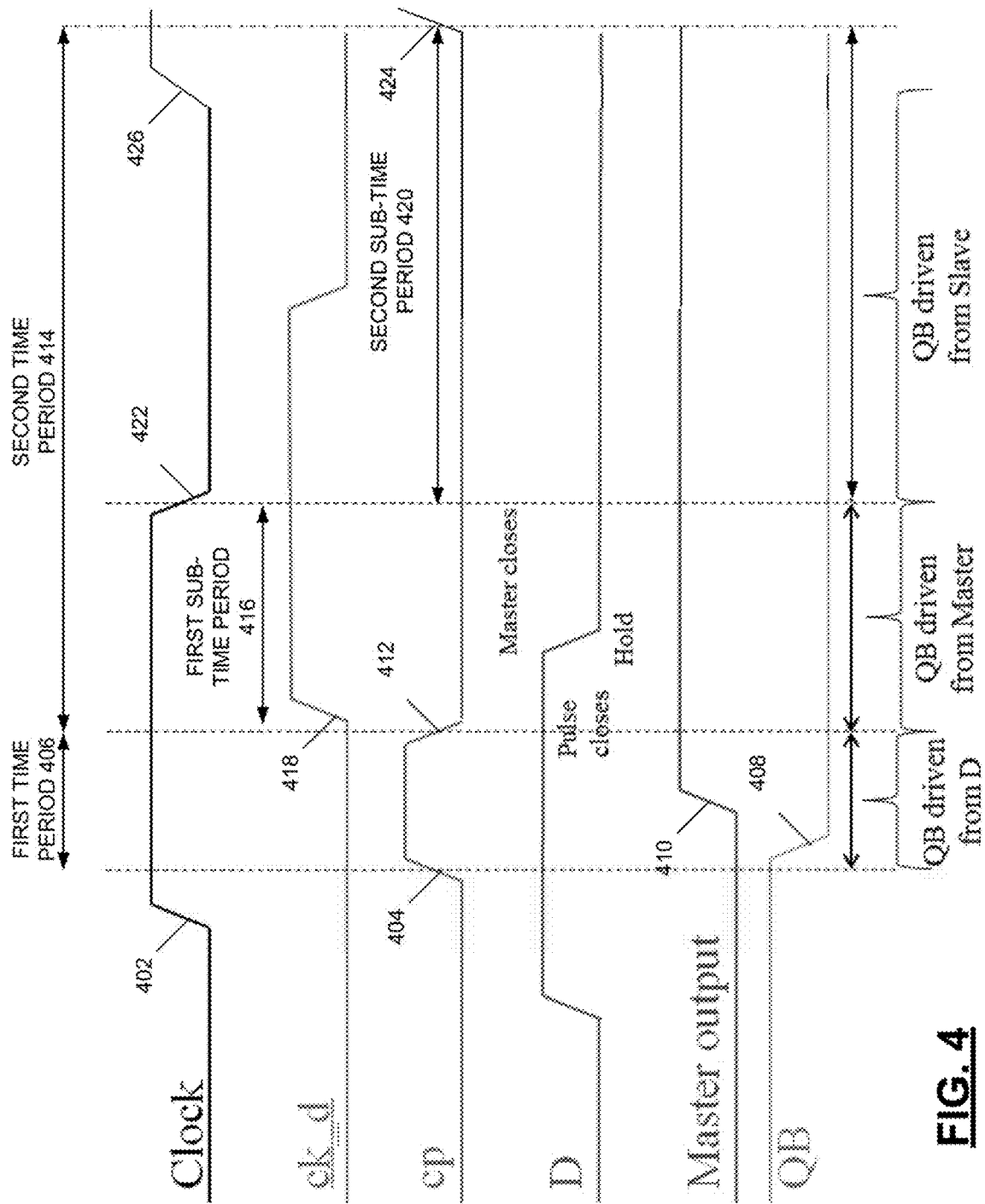
FIG. 4 is a timing diagram illustrating example operation of a data storage element that comprises a master latch and a slave latch.

FIG. 4 is a timing diagram illustrating example operation of a data storage element that comprises a master latch and a slave latch. A rising edge of clock signal 310, received at 402, signals the data storage element 300 to read data from the data input 302. In response to the rising clock signal 310, namely the edge at 402, the pulse generator 318 asserts a pulse signal 320 at 404, signaling the beginning of a first time period 406. During the first time period 406, the data storage element 300 outputs at 314 input data received from the data input 302 via bypass path 311, without passing through either of the master latch 304 or the slave latch 306. Outputting data at 314 via the bypass path 311 is evidenced by the transition of output data signal QB transition at 408, opposite to the data signal D based on the inverting nature of the multiplexer 316. During the first time period 406, based on receipt of the clock signal edge 402, the master latch 304 samples and holds data from the data input 302. Successful master latch sampling is illustrated at 410, where the master latch output 308 transitions to match the data signal 302 level. At the end of the predetermined length first time period 406, the pulse generator 318 deasserts the pulse signal at 412 signaling the end of the first time period 406 and the beginning of the second time period 414. During a first sub-time period 416 of the second time period 414, the multiplexer 316 selects the master latch output 308 as the value to represent at the output 314 of the data storage element 300. During the first sub-time period 416, the slave latch 306 samples and holds data present at the output 308 of the master latch 304. In one embodiment of the disclosure, this sampling is automatic based on the clock signal rising edge 402 and an internal delay. In another embodiment of the disclosure, the slave latch 306 sampling is based on an external delayed clock signal, as depicted at 418. The multiplexer 316 transitions from the first sub-time period 416 to a second sub-time period 420 based on the falling edge 422 of the clock signal 310. During the second sub-time period 420, the multiplexer 316 outputs data from the slave latch output 312, where the slave latch 306 has sampled the master latch output 308 during the first sub-time period 416. The output from the slave latch 306 is maintained as the output 314 of the data storage element 300 until a reassertion of the pulse signal at 424, and new first time period 406, based on a newly received rising clock edge at 426.

Figure 5:
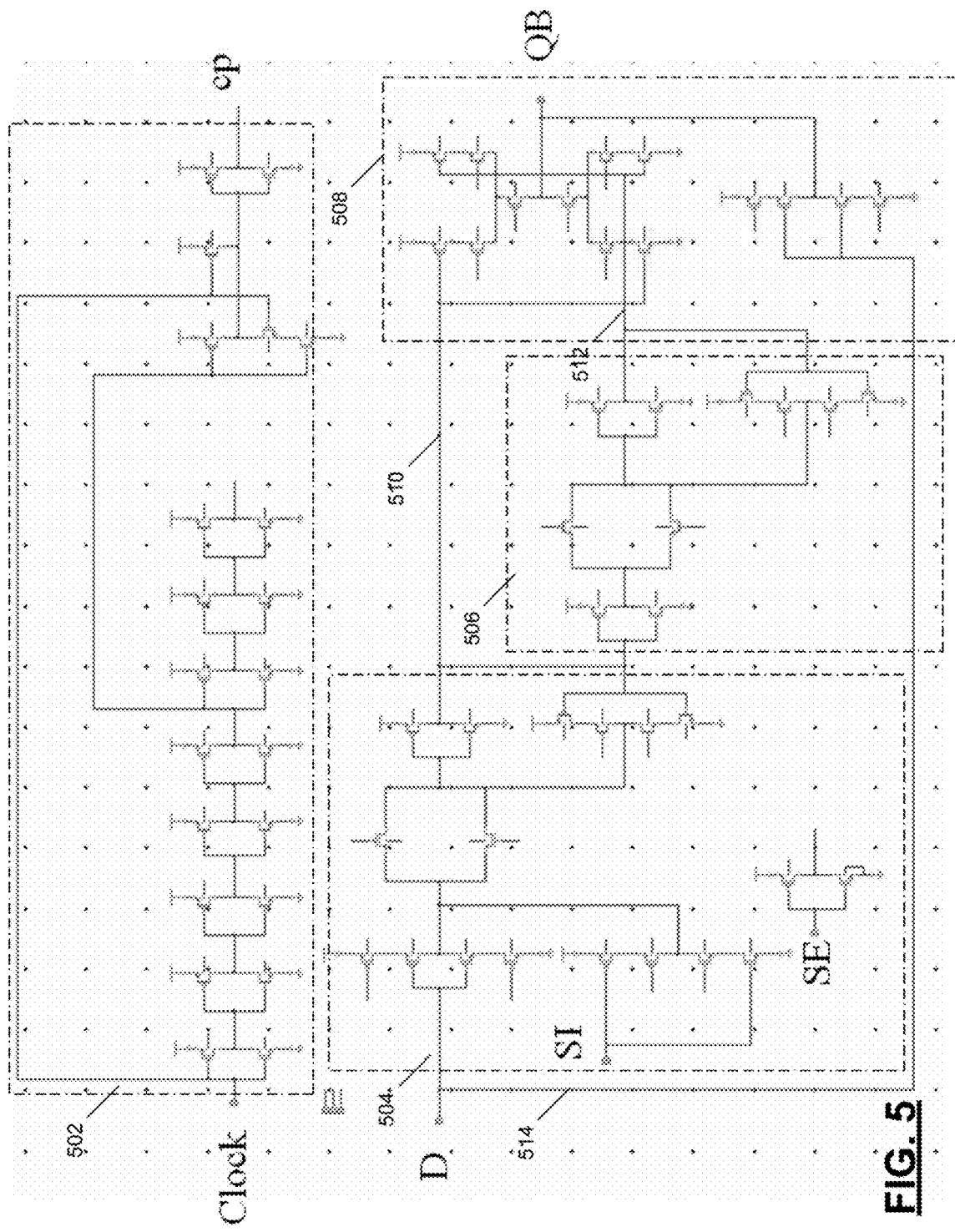
FIG. 5 is a schematic diagram for a data storage element in one embodiment of the disclosure.

FIG. 5 is a schematic diagram for a data storage element in one embodiment of the disclosure. A pulse generator portion is depicted at 502, where the pulse generator portion 502 is configured to assert a pulse signal based on a clock signal. A master latch portion is depicted at 504, where the master latch 504 is configured to sample and hold data from the data input. A slave latch portion is depicted at 506, where the slave latch 506 is configured to sample and hold data from the master latch 504. A multiplexer portion is depicted at 508, where the multiplexer 508 is configured to select one of a master latch output via 510 a slave latch output via 512 or a data bypass path 514 to output at QB from the data storage element.

Figure 6:
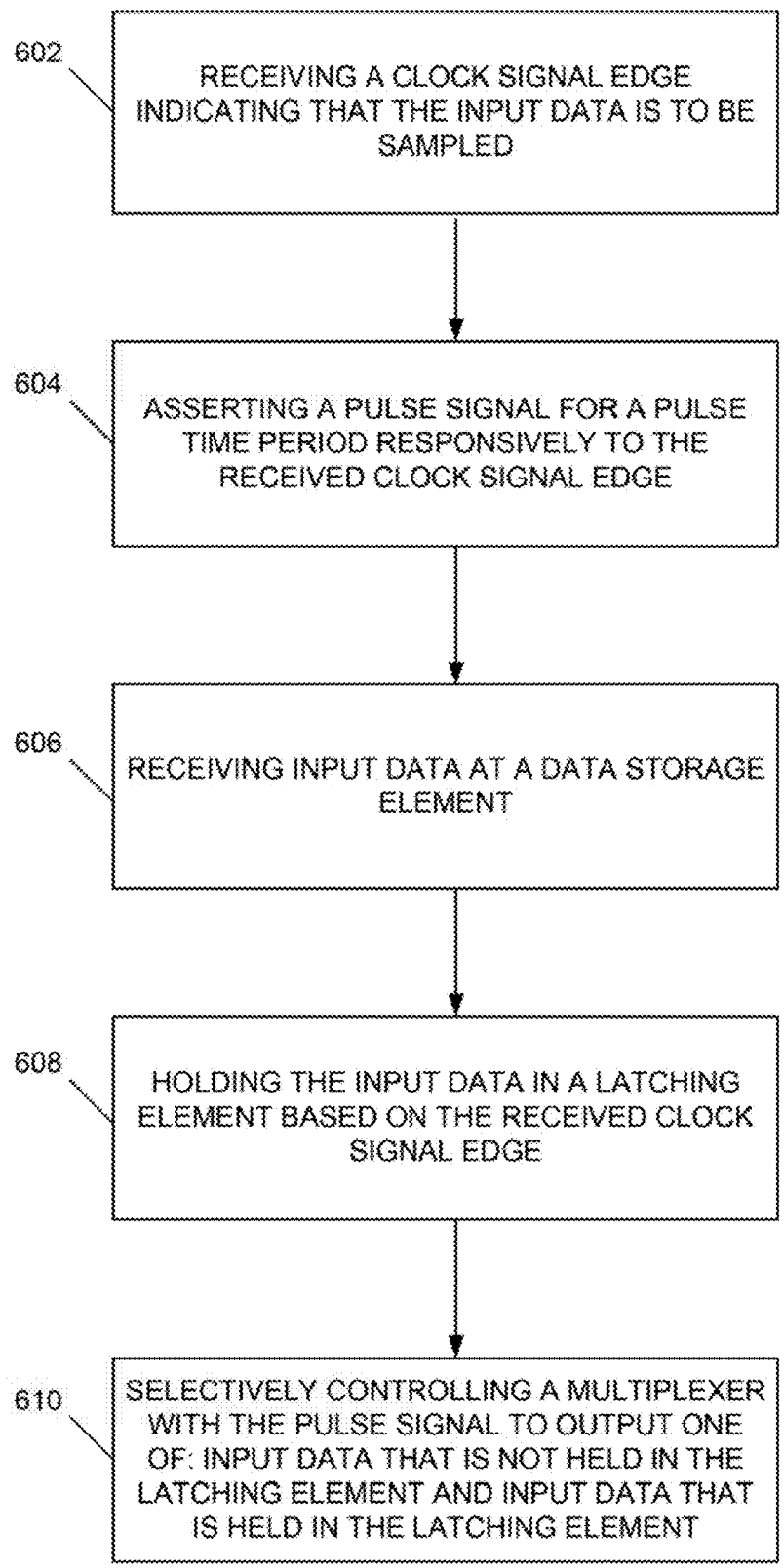
FIG. 6 is a flow diagram depicting a method of providing data from a storage element.

FIG. 6 is a flow diagram depicting a method of providing data from a storage element. In an embodiment of the disclosure utilizing a transparent flip flop, a clock signal is received at 602, followed by assertion of a pulse signal at 604. Input data is received at 606, and that input data is held at 608. At 610, a multiplexer is selectively controlled based on the pulse signal to output received data.

Figure 7:
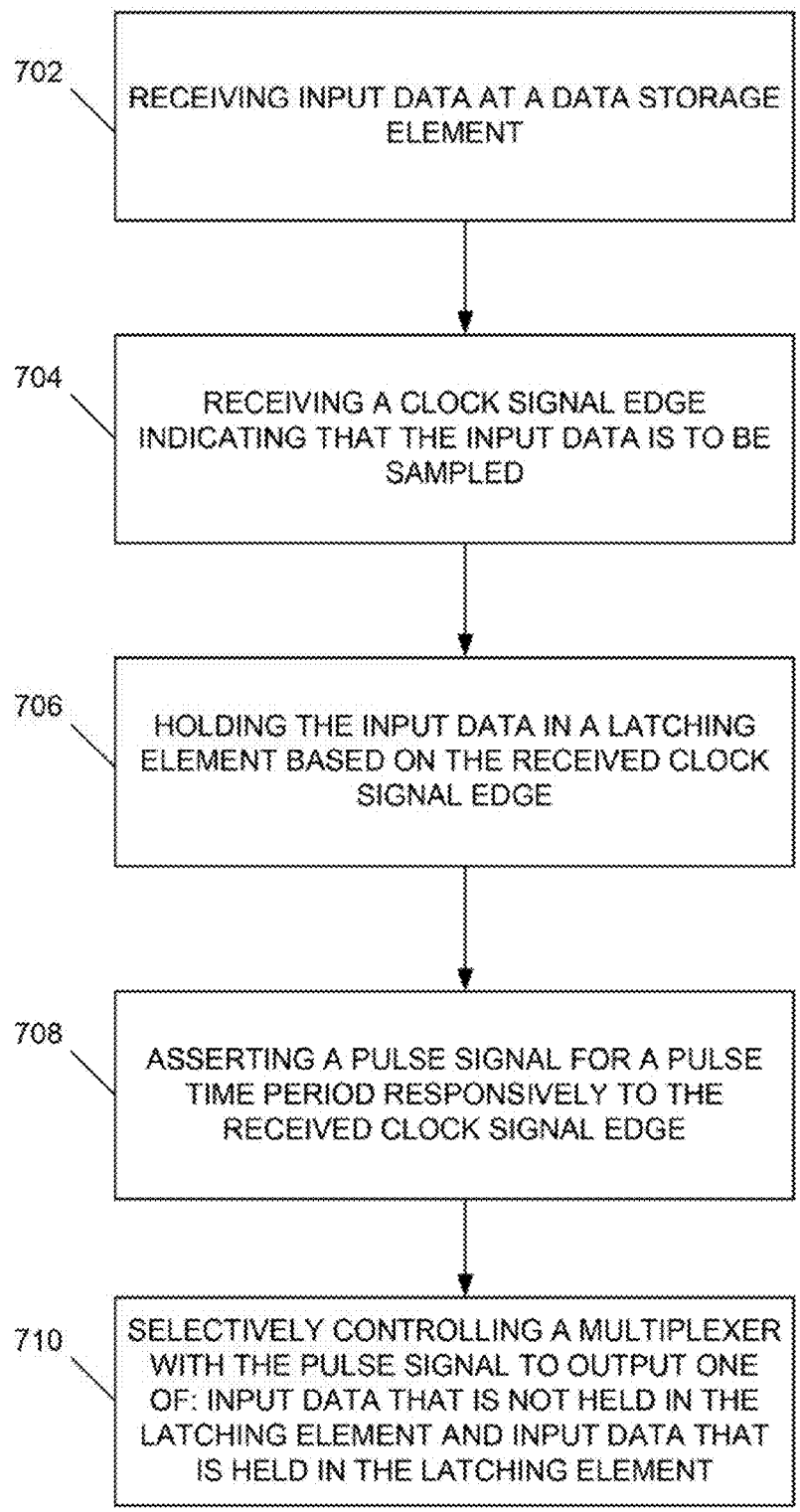
FIG. 7 is a flow diagram depicting a method of providing data from a storage element in another embodiment of the disclosure.

FIG. 7 is a flow diagram depicting a method of providing data from a storage element in another embodiment of the disclosure. At 702, input data is received at a data storage element. At 704, a clock signal edge indicating that the input data is to be sampled is received. The input data is held in a latching element based on the received clock signal edge at 706. At 708, a pulse signal is asserted for a pulse time period responsively to the received clock signal edge. At 710, a multiplexer is selectively controlled with the pulse signal to output one of: input data that is not held in the latching element and input data that is held in the latching element. In other embodiments and operational scenarios, the steps may further be reordered.

Figure 8:
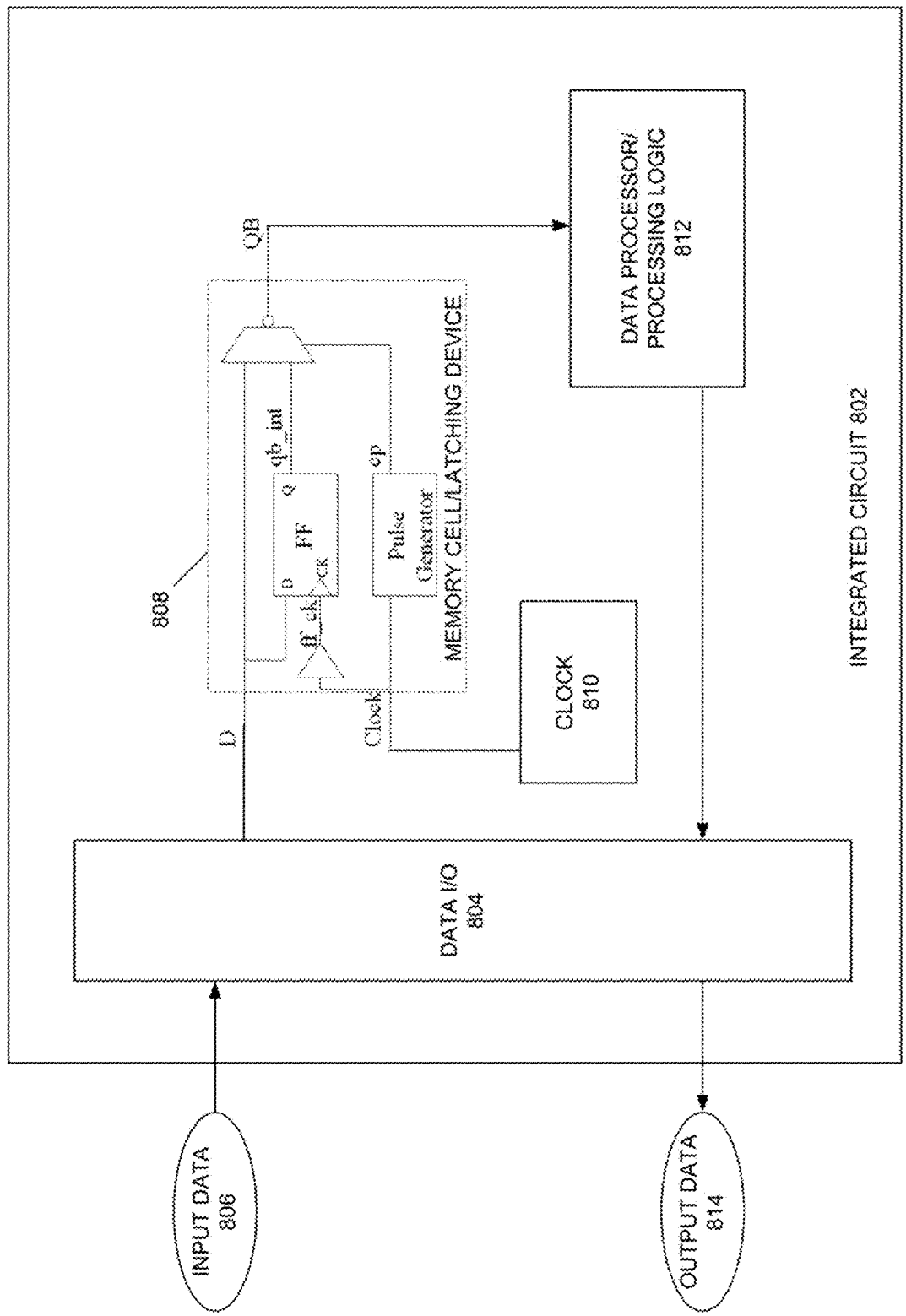
FIG. 8 is a block diagram depicting a data storage element disposed on an integrated circuit.

FIG. 8 is a block diagram depicting a data storage element disposed on an integrated circuit. An integrated circuit 802 includes a data input/output interface 804 that receives input data 806. In the example of FIG. 8, that input data 806 is provided to a data storage element 808 that acts as a data buffer. A clock 810 provides a clock signal to the data storage element 808, instructing the data storage element as to when input data 806 is expected to be present. The data storage element 808 samples and holds that input data and provides the input data to a data processor/processing logic 812. That data is processed and subsequently outputted as output data 814 via the data input/output interface 804.

The integrated circuit of FIG. 8 is varied in other embodiments of the disclosure. In one embodiment of the disclosure, multiple data storage elements 808 are utilized for storing a number of bits/bytes of data. In another embodiment of the disclosure, the data storage element acts as a post-processing buffer that receives data from the data processor/processing logic 812 prior to transmitting that processed data as output data 814. In a further embodiment, the data storage element 808 is utilized by the data processor/processing logic 812 for storage of intermediate data during processing. In additional embodiments of the disclosure, the integrated circuit 802 is a component of an electronic device, such as a mobile communications device, a server, or a controller.

This application uses examples to illustrate the invention. The patentable scope of the invention includes other examples.

What is claimed is:

1. A data storage element, comprising:
   a data input configured to receive input data to the data storage element;
   a latching element that is configured to hold input data that is received from the data input, wherein the latching element comprises a master latch and a slave latch, wherein the master latch captures input data from the data input based on a clock signal, and wherein the slave latch captures input data from the master latch based on the clock signal;
   a pulse generator that is configured to assert a pulse signal based on the clock signal; and
   a multiplexer that is configured to select for output from the data storage element, responsively to the pulse signal, one of the input data that is received from the data input without passing through the latching element and the input data held in the latching element.

2. The data storage element of claim 1, wherein the pulse generator is configured to assert the pulse signal for selection of the input data from the data input without passing through the latching element during a first time period, wherein the multiplexer is configured to select the input data from the latching element during a second time period when the pulse signal is deasserted, wherein the first time period comprises a period between assertion and deassertion of the pulse signal, and wherein the second period comprises a period between deassertion of the pulse signal and a reassertion of the pulse signal.

3. The data storage element of claim 2, wherein the multiplexer is configured to select an output from the master latch or an output from the slave latch during the second time period based on the clock signal.

4. The data storage element of claim 3, wherein the multiplexer is configured to select the output from the master latch during a first sub-time period of the second time period, and wherein the multiplexer is configured to select the output from the slave latch during a second sub-time period of the second time period, wherein the multiplexer is configured to transition from selecting the master latch output to selecting the slave latch output based on the clock signal.

5. The data storage element of claim 1, wherein the multiplexer is an inverting multiplexer configured to perform a logic inversion on input data received from the data input or the latching element.

6. The data storage element of claim 2, wherein the input data transitions during the first time period, the data storage element is configured to reflect the input data transition at the output during the first time period.

7. The data storage element of claim 1, wherein the latching element is configured to hold and release the input data irrespective of the pulse signal.

8. A method of providing data from a data storage element, comprising:
   receiving input data at a data storage element;
   receiving a first clock signal edge indicating that the input data is to be sampled;
   holding the input data in a latching element based on the first clock signal edge, wherein the holding of the input data in the latching element includes:
      sampling the input data using a master latch based on the first clock signal edge, and
      sampling an output of the master latch using a slave latch based on a second clock signal edge;
   asserting a pulse signal for a pulse time period responsively to the first clock signal edge;
   selectively controlling a multiplexer with the pulse signal to output one of: input data that is not held in the latching element and input data that is held in the latching element.

9. The method of claim 8, wherein selectively controlling the multiplexer comprises:
   outputting the input data without using the latching element while the pulse signal is asserted during a first time period, and
   outputting the input data from the latching element after the pulse signal is deasserted during a second time period;
   wherein the first time period comprises a period between assertion and deassertion of the pulse signal, and wherein the second period comprises a period between deassertion of the pulse signal and reassertion of the pulse signal.

10. The method of claim 9, wherein outputting the input data from the latching element during the second time period comprises:
    outputting the input data from the output of the master latch during a first sub-time period of the second time period; and
    outputting the input data from an output of the slave latch during a second sub-time period of the second time period.

11. The method of claim 10, further comprising:
    transitioning from the first sub-time period to the second sub-time period of the second time period based on the second clock signal edge.

12. An integrated circuit, comprising:
    a data storage element, comprising:
       a data input configured to receive input data to the data storage element;
       a latching element that is configured to hold input data that is received from the data input, wherein the latching element comprises a master latch and a slave latch, wherein the master latch captures input data from the data input based on a clock signal, and wherein the slave latch captures input data from the master latch based on the clock signal;

a pulse generator that is configured to assert a pulse signal based on the clock signal; and a multiplexer that is configured to select for output from the data storage element, responsively to the pulse signal, one of the input data that is received from the data input without passing through the latching element and the input data from the latching element.

13. The integrated circuit of claim 12, wherein the pulse generator is configured to assert the pulse signal for selection of the input data from the data input without passing through the latching element during a first time period, wherein the multiplexer is configured to select the input data from the latching element during a second time period when the pulse signal is deasserted, wherein the first time period comprises a period between assertion and deassertion of the pulse signal, and wherein the second period comprises a period between deassertion of the pulse signal and a reassertion of the pulse signal.

14. The integrated circuit of claim 13, wherein the multiplexer is configured to select the output from the master latch during a first sub-time period of the second time period, and wherein the multiplexer is configured to select the output from the slave latch during a second sub-time period of the second time period, wherein the multiplexer is configured to transition from selecting the master latch output to selecting the slave latch output based on the clock signal.

15. An electronic device comprising the integrated circuit of claim 12.

16. The electronic device of claim 15, wherein the electronic device is a mobile communications device, a server, or a controller.

* * * * *